US007338577B2

(12) United States Patent
Yeom et al.

(10) Patent No.: US 7,338,577 B2
(45) Date of Patent: Mar. 4, 2008

(54) INDUCTIVELY COUPLED PLASMA PROCESSING APPARATUS HAVING INTERNAL LINEAR ANTENNA FOR LARGE AREA PROCESSING

(75) Inventors: Geun-Young Yeom, Seoul (KR); Young-Joon Lee, Seoul (KR); Kyong-Nam Kim, Daejeon (KR)

(73) Assignee: Sungkyukwan University, Seoul (KR)

( * ) Notice: Subject to any disclaimer, the term of this patent is extended or adjusted under 35 U.S.C. 154(b) by 0 days.

(21) Appl. No.: 10/438,221

(22) Filed: May 15, 2003

(65) Prior Publication Data

US 2004/0221814 A1 Nov. 11, 2004

(30) Foreign Application Priority Data

May 7, 2003 (KR) ..................... 10-2003-0028849

(51) Int. Cl.
*C23C 16/00* (2006.01)
*H01L 21/306* (2006.01)

(52) U.S. Cl. ............................. 156/345.48; 118/723 I; 118/723 AN

(58) Field of Classification Search ............ 118/723 I, 118/723 IR, 723 AN; 156/345.48, 345.49; 315/111.51
See application file for complete search history.

(56) References Cited

U.S. PATENT DOCUMENTS 5,464,476 A 11/1995 Gibb et al.
5,531,834 A * 7/1996 Ishizuka et al. .......... 118/723 I
5,565,738 A * 10/1996 Samukawa et al. ..... 315/111.51
5,838,111 A * 11/1998 Hayashi et al. ......... 315/111.21
6,071,372 A * 6/2000 Ye et al. ................ 156/345.48
6,341,574 B1 * 1/2002 Bailey et al. ............. 118/723 I
6,534,922 B2 * 3/2003 Bhardwaj et al. ....... 315/111.51
2003/0168172 A1 * 9/2003 Glukhoy ................ 156/345.28

FOREIGN PATENT DOCUMENTS

| | | | |
|---|---|---|---|
| JP | 09-293682 | | 11/1997 |
| JP | 11-87096 | * | 3/1999 |
| JP | 2000-208298 | * | 7/2000 |
| KR | 1999-0080959 | | 11/1999 |
| KR | 2000-0053680 | | 9/2000 |
| KR | 1020010030355 | | 4/2001 |

* cited by examiner

*Primary Examiner*—Luz Alejandro-Mulero
(74) *Attorney, Agent, or Firm*—Foley & Lardner LLP

(57) ABSTRACT

An inductively coupled plasma processing apparatus for a large area processing, the inductively coupled plasma processing apparatus comprising: a reaction chamber; a plurality of linear antennas horizontally arranged at an inner upper portion of the reaction chamber while being spaced from each other by a predetermined distance for receiving induced RF power, the linear antennas being coupled to each other at an outer portion of the reaction chamber, the linear antennas including at least one bending antenna formed by connecting first ends of adjacent antennas, which are exposed to the outer portion of the reaction chamber, to each other; and at least one magnet positioned adjacent to the linear antennas for creating a magnetic field perpendicularly crossing an electric field created by the linear antennas in such a manner that electrons perform a spiral movement.

7 Claims, 4 Drawing Sheets

32
40
30
42
32
50

INDUCTIVELY COUPLED PLASMA PROCESSING APPARATUS HAVING INTERNAL LINEAR ANTENNA FOR LARGE AREA PROCESSING

BACKGROUND OF THE INVENTION

1. Field of the Invention

The present invention relates to an inductively coupled plasma processing apparatus, and more particularly to an inductively coupled plasma processing apparatus, in which a linear antenna creating an electric field and a permanent magnet creating a magnetic field are simultaneously accommodated in a reaction chamber for carrying out a plasma etching process over a large area.

2. Description of the Related Art

Generally, an inductively coupled plasma (ICP) processing apparatus includes a spiral type antenna, which is installed at an upper outer portion of a reaction chamber by interposing dielectric material between the spiral type antenna and the reaction chamber performing a plasma etching process. When induced radio frequency power is applied to the spiral type antenna, an electric field is created in the reaction chamber, thereby generating plasma in the reaction chamber. The ICP processing apparatus has a simple structure as compared with structures of ECR (Electron cyclotron resonance) and HWEP (Helicon-wave excited plasma) processing devices, so the ICP processing apparatus can generate plasma over a large area with a relatively simple manner, so that the ICP processing apparatus is widely used and developed.

A spiral type ICP source has been widely used as an antenna source for obtaining high-efficiency and high-density plasma. FIG. 1A is a schematic view showing a conventional ICP chamber. An antenna source is positioned at an uppermost part of the ICP chamber such that it is exposed to an exterior. In addition, dielectric material is positioned between the ICP chamber and the antenna source so as to insulate the antenna source from the ICP chamber while maintaining a vacuum state. FIG. 1B is a view showing a shape of a spiral type antenna source used in the ICP chamber. However, the spiral type antenna source causes problems as the size of the ICP chamber is enlarged. Firstly, size and thickness of dielectric material, which maintains the vacuum state between the antenna source and the ICP chamber, are increased as the ICP chamber is enlarged, thereby increasing the manufacturing cost. In addition, since a distance between the antenna source and plasma is remote from each other, plasma efficiency is lowered. Moreover, a length of the antenna source is correspondingly increased as the ICP chamber is enlarged, so power loss is caused due to resistance of the antenna source and an evenness of the spiral type antenna source is created. In addition, if a power supply applying RF power of 13.56 MHz to the ICP chamber is used, a standing wave effect occurs in a source corresponding to a half wavelength of 13.56 MHz.

SUMMARY OF THE INVENTION

The present invention has been made to solve the above problems of the conventional ICP processing apparatus, therefore, it is an object of the present invention to provide an ICP processing apparatus having internal linear antenna for large are processing and capable of preventing a standing wave effect, which is a sort of an interference phenomenon caused when a total length of a source matches with a half wavelength value of a power supply of 13.56 MHz. In this case, a traveling wave is interfered with a reflecting wave, so the wave seems to be stopped without moving any directions.

To achieve the object of the present invention, there is provided an inductively coupled plasma processing apparatus for a large area processing, the inductively coupled plasma processing apparatus comprising: a reaction chamber; a plurality of linear antennas horizontally arranged at an inner upper portion of the reaction chamber while being spaced from each other by a predetermined distance for receiving induced RF power, the linear antennas being coupled to each other at an outer portion of the reaction chamber, the linear antennas including at least one bending antenna formed by connecting first ends of adjacent antennas, which are exposed to the outer portion of the reaction chamber, to each other; and at least one magnet positioned adjacent to the linear antennas for creating a magnetic field perpendicularly crossing an electric field created by the linear antennas in such a manner that electrons perform a spiral movement.

According to another embodiment of the present invention, there is provided an inductively coupled plasma processing apparatus for a large area processing, the inductively coupled plasma processing apparatus comprising: a reaction chamber; a plurality of linear antennas horizontally and linearly arranged at an inner upper portion of the reaction chamber while being spaced from each other by a predetermined distance for receiving induced RF power, the linear antennas including a plurality of first linear antennas and second linear antennas arranged between the first linear antennas, first ends the first linear antennas being protruded out of the reaction chamber and coupled to each other so as to be connected to a first induced RF power section, first ends of the second linear antennas being protruded out of the reaction chamber in opposition to the first ends of the first linear antennas and coupled to each other so as to be connected to a second induced RF power section; and at least one magnet positioned adjacent to the linear antennas for creating a magnetic field perpendicularly crossing an electric field created by the linear antennas in such a manner that electrons perform a spiral movement.

Second ends of the first and second linear antennas, which are opposite to the first ends of the first and second linear antennas, are grounded. The linear antennas are surrounded by antenna protecting tubes made of quartz. The linear antennas are fabricated by using any one selected from the group consisting of copper, stainless steel and aluminum.

The magnet includes a plurality of magnets, which are horizontally positioned between adjacent linear antennas while being spaced from each other. The magnet has a linear shape corresponding to a shape of the linear antennas. The magnets are provided in such a manner that adjacent two magnets have poles different from each other. The magnets are surrounded by magnet protecting tubes made of quartz.

BRIEF DESCRIPTION OF THE DRAWINGS

The above object and other advantages of the present invention will become more apparent by describing in detail preferred embodiments thereof with reference to the attached drawings in which.

DETAILED DESCRIPTION OF THE PREFERRED EMBODIMENTS

Hereinafter, preferred embodiments of the present invention will be described in detail with reference to accompanying drawings. The preferred embodiments described below will not limit the scope of the present invention, but show examples of the present invention.

Figure 1A:
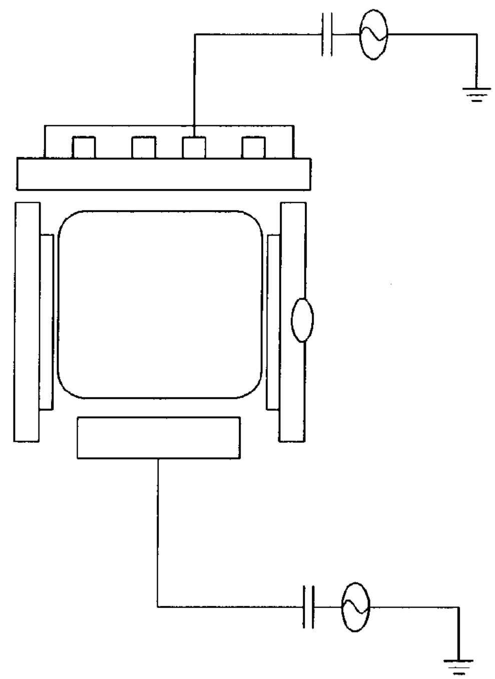
FIGS. 1A and 1B are schematic views showing a conventional ICP processing apparatus and an antenna source, respectively.
Figure 1B:
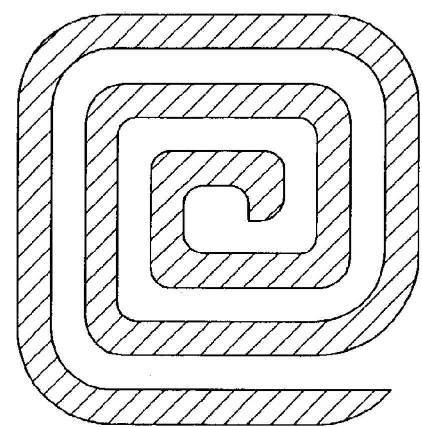
Figure 2:
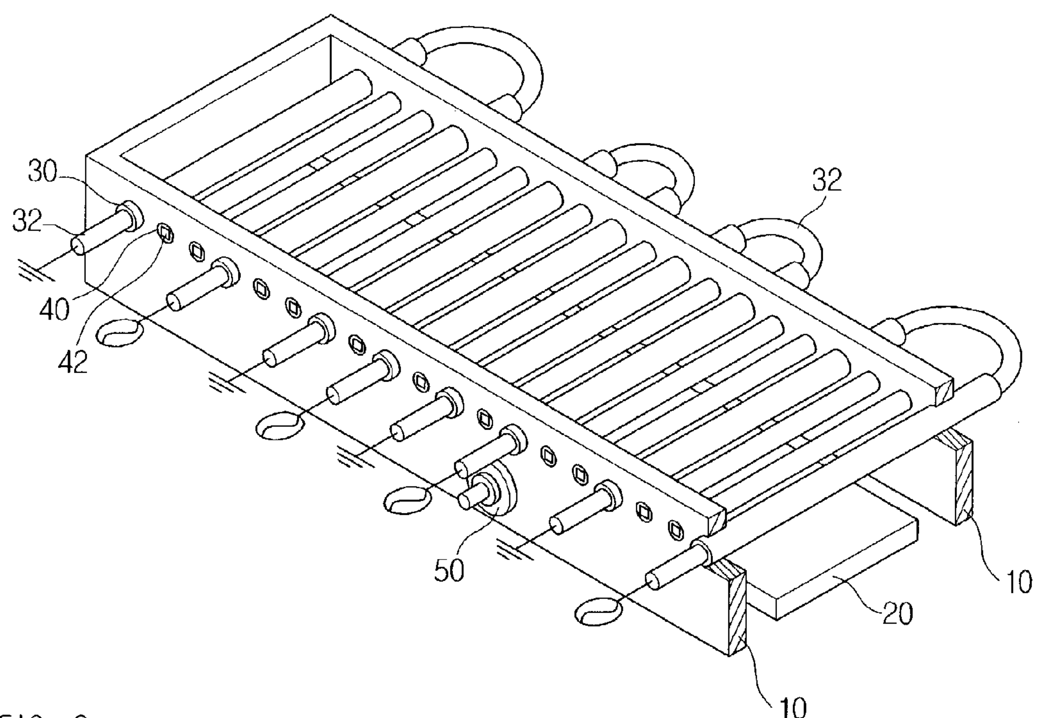
FIG. 2 is a schematic perspective view of an internal linear antenna according to one embodiment of the present invention.

FIG. 2 is a schematic perspective view of an internal linear antenna according to one embodiment of the present invention. Referring to FIG. 2, a stage 20 is installed at a lower portion of a reaction chamber 10 in order to place a substrate (not shown) thereon in such a manner that a plasma etching process or a deposition process is carried out with respect to the substrate. Preferably, the stage 20 moves up and down and can be formed as an electrostatic chuck.

An exhaust line connected to a vacuum pump (not shown) is formed at a bottom wall or at a part of a sidewall of the reaction chamber 10.

A bias power section is connected to the stage 20 in order to apply bias power to the stage 20. In addition, a bias voltage-measuring device (not shown) is installed on the stage 20 in order to measure bias voltage.

An inner upper portion of the reaction chamber 10 is a plasma source region, in which a plurality of linear antennas 32 are horizontally arranged adjacent to each other. The linear antennas 32 are linearly aligned in the reaction chamber 10. However, the linear antennas 32 are bent at an external portion of the reaction chamber 10 and connected to each other in series.

Permanent magnets 42 are arranged below the linear antennas 32. The permanent magnets 42 are surrounded by magnet protecting tubes 40, which are made of maternal having superior resistance against a sputtering process, such as quartz. A Langmuir probe 50 is installed below the linear antennas 32. The Langmuir probe 50 is protruded from a sidewall of the reaction chamber 10.

According to the present embodiment, the reaction chamber 10 has a hexahedral shape and four linear antennas 32 are accommodated in the reaction chamber 10. Each linear antenna 32 is inserted into an antenna protecting tube 30 in the reaction chamber 10. The antenna protecting tube 30 is made of maternal having superior resistance against the sputtering process, such as quartz. The linear antenna 32 is made of copper. One end of the linear antenna 32 is grounded and the other end of the linear antenna 32 is connected to an induced RF power section 60 for achieving an induced power discharge. Selectively, the linear antenna 32 can be fabricated by using stainless steel, silver, or aluminum.

The Langmuir probe 50 is available from Hiden Analytical Inc. of Great Britain. The Langmuir probe 50 measures plasma characteristic such as plasma density and plasma uniformity from the IPC processing apparatus having internal linear antennas 32 according to the present invention. Argon gas is used for monitoring the plasma characteristics. The Langmuir probe 50 is installed downwardly remote from the linear antenna 32 by a predetermined distance.

In addition, since an N-pole and an S-pole of permanent magnets 42 installed below the linear antennas 32 are alternately arranged, a direction of magnetic filed created by magnetic lines positioned between the permanent magnets 42 is perpendicularly crossing the electric field, so electrons spirally moves in the magnetic field and the electric field. That is, a moving route of electrons is enlarged through the magnetic field and the electric field, so that a collision probability between neutrons and electrons is increased. As the collision probability between neutrons and electrons is increased due to the electrons spirally moved in the magnetic field and electric field, ion density is increased and electron mobility is lowered, thereby reducing an electron loss.

The linear antennas 32 consist of four loops. First and fourth loops have the same size with each other and second and third loops, which are positioned between first and fourth loops, have the same size with each other to achieve plasma uniformity. Plasma density and uniformity are changed depending on the size of the loops, so user can adjust plasma density and uniformity by varying the size of the loops. That is, it is possible to improve plasma uniformity and plasma density when the linear antennas are utilized in a super-large area plasma chamber by adjusting the size or the number of loops. In addition, one end of each loop is connected to a matching box to receive power from the matching box and the other end of each loop is grounded to the reaction chamber 10. A length of one loop is less than 3 m when it is mounted on the reaction chamber having a size of 1,020 mm×920 mm, thereby preventing the standing wave effect.

Figure 3:
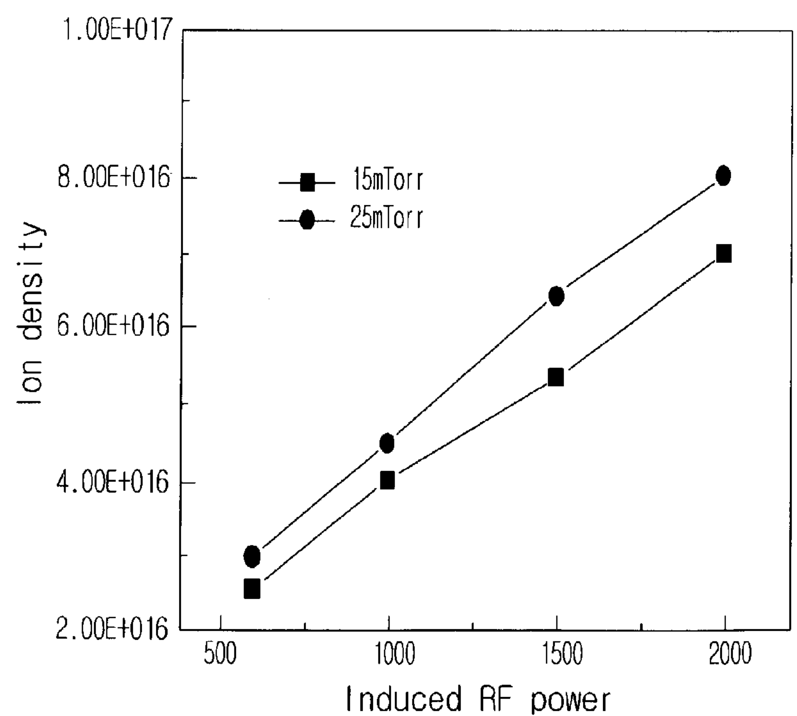
FIG. 3 is a graph showing plasma density as a function of RF power according to one embodiment of the present invention.

FIG. 3 is a graph showing plasma density as a function of RF power according to the present invention. As shown in FIG. 3, high-density plasma about 8.00E+016/$m^3$ can be obtained under process pressure 25 mTorr and input power 2000W.

Figure 4:
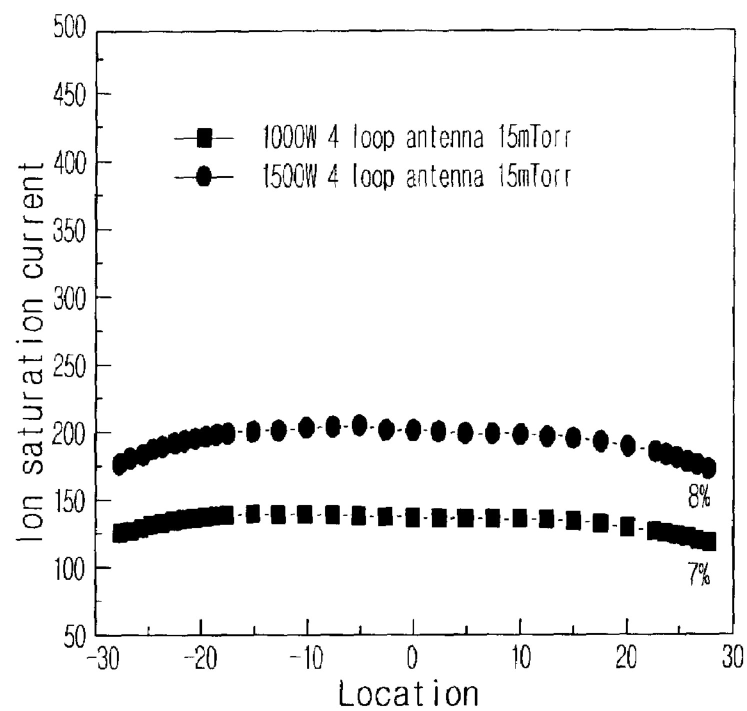
FIG. 4 is a graph showing plasma uniformity when RF power is applied to linear antennas according to one embodiment of the present invention.

FIG. 4 is a graph showing plasma uniformity when RF power is applied to linear antennas according to the present invention. As shown in FIG. 4, plasma uniformity is an important factor for forming plasma over a large area. In case of the linear antenna 32, plasma uniformity is represented as 7-8%, which is obtained by measuring ion saturation current using the Langmuir probe.

Figure 5:
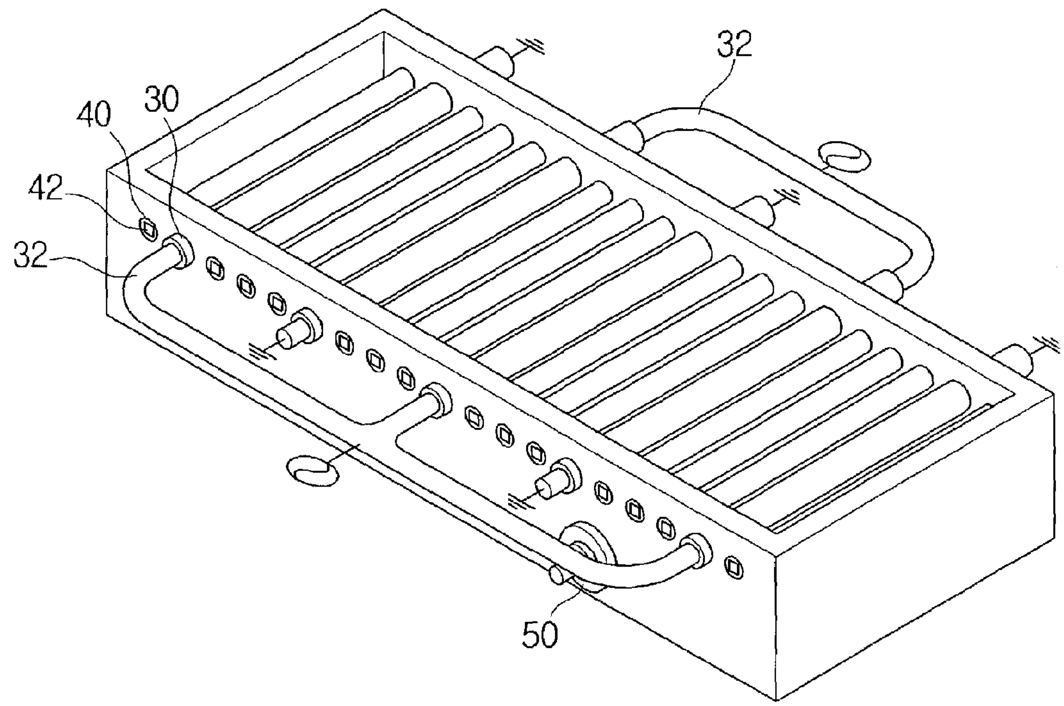
FIG. 5 is a schematic perspective view of an internal linear antenna according to another embodiment of the present invention.

FIG. 5 is a schematic perspective view of an internal linear antenna according to another embodiment of the present invention. Referring to FIG. 5, some of loops protruded out of the reaction chamber 10 are selected. The selected loops are remote from each other. Then, first ends of the selected loops are coupled to each other in the vicinity of a first sidewall region of the reaction chamber 10 and connected to the induced RF power section for achieving the induced power discharge. Second ends of the loops, which are opposite to the first ends, are grounded in the vicinity of a second sidewall region of the reaction chamber 10. In the following description, the above structure is called "comb type double antenna".

In addition, first ends of non-selected loops are coupled to each other in the vicinity of the second sidewall region of the reaction chamber 10, at which the selected loops are grounded and second ends of non-selected loops are grounded in the vicinity of the first sidewall region of the reaction chamber 10, at which the selected loops are coupled to each other.

Thus, two different comb type antennas receive RF power in one matching box so as to discharge plasma. As shown in FIG. 5, five loops are grounded. In addition, RF power passes through a path having a length about 1.5 m, which is corresponding to a transverse length of the reaction chamber 10, so the antenna source can completely remove the standing wave effect. The antenna source can effectively utilized for discharging plasma even if it is used in a super-large area plasma discharging process.

Figure 6:
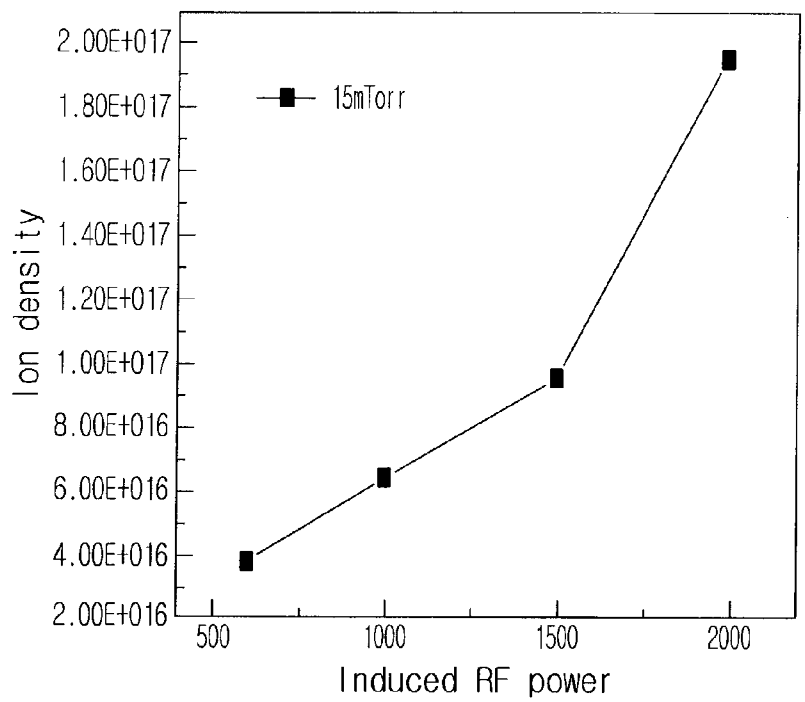
FIG. 6 is a graph showing plasma density as a function of RF power applied to linear antennas according to another embodiment of the present invention.

FIG. 6 is a graph showing plasma density as a function of RF power applied to linear antennas according to another embodiment of the present invention. As shown in FIG. 6, plasma density is represented as 1.90E+017/$m^3$ when RF power of 2000W is applied. As is understood from FIG. 6, plasma is stably generated when high-RF power is applied. Therefore, when plasma is discharged in a next-generation super-large area plasma processing chamber by applying high-RF power, the antenna source of the present invention can stably generate plasma.

In addition, the antenna source achieves high-plasma density even if relatively low RF power is applied thereto, so it acts as a high-efficiency plasma source.

Figure 7:
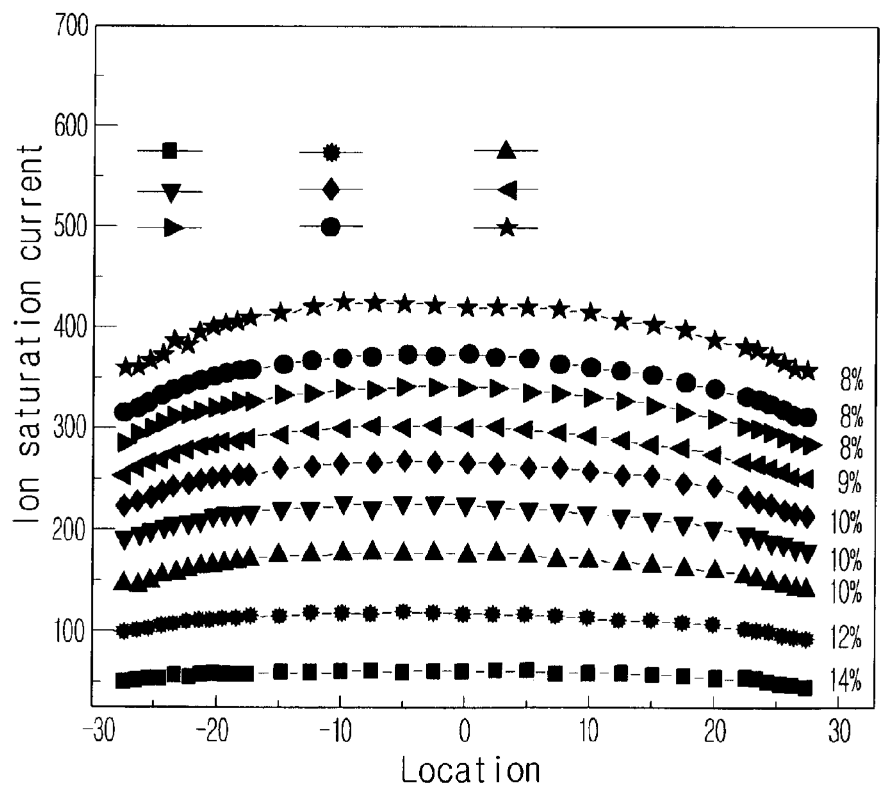
FIG. 7 is a graph showing uniformity of a plasma discharging area according to another embodiment of the present invention.

FIG. 7 is a graph showing uniformity of a plasma discharging area according to another embodiment of the present invention. As shown in FIG. 7, uniformity of the plasma discharging area is represented to 8% and 14% as RF power is changed from 600W to 500W.

In the applicant's experiment, the antenna sources are installed in equidistance. However, when the antenna sources are installed in the super-large area reaction chamber, a distance between the antenna sources can be adjusted so as to control uniformity of plasma. In addition, it is possible to achieve super-large area plasma source by varying the number of antenna sources while maintaining the comb-type structure.

The comb-type linear antenna 32 of the present embodiment can effectively remove the standing wave effect by shortening a length of an RF power path.

As described above, the ICP processing apparatus of the present invention has internal linear antennas coupled to permanent magnets for performing a large area plasma process, so an electric field is perpendicularly coupled to a magnetic filed in a plasma creating area in a reaction chamber. Accordingly, electrons can spirally move in the electric and magnetic fields, so a moving route of electrons can be increased. Thus, a collision probability between neutrons and electrons can be increased. In addition, plasma density is improved and an electron temperature is lowered as RF power is increased. Furthermore, plasma uniformity can be maintained within 10% when performing the super-large area plasma process while stably generating plasma.

While the present invention has been described in detail with reference to the preferred embodiments thereof, it should be understood to those skilled in the art that various changes, substitutions and alterations can be made hereto without departing from the scope of the invention as defined by the appended claims.

What is claimed is:

1. An inductively coupled plasma processing apparatus for a large area processing, the inductively coupled plasma processing apparatus comprising:

a reaction chamber;

a double comb-type antenna structure comprising a plurality of linear antennas horizontally and linearly arranged at an inner upper portion of the reaction chamber while being spaced from each other by a predetermined distance for receiving induced RF power, the linear antennas including a plurality of first linear antennas and second linear antennas arranged between the first linear antennas, first ends of the first linear antennas being protruded out of the reaction chamber and coupled to each other so as to be connected to a first induced RF power section, first ends of the second linear antennas being protruded out of the reaction chamber in opposition to the first ends of the first linear antennas and coupled to each other so as to be connected to a second induced RF power section, the first linear antennas being different from and electrically separated from the second linear antennas; and a plurality of magnets positioned relative to the linear antennas for creating a magnetic field perpendicularly crossing an electric field created by the linear antennas in such a manner that electrons perform a spiral movement;

wherein the plurality of magnets are positioned below the linear antennas and arranged between one of the first linear antennas and one of the second linear antennas adjacent to each other and parallel to each other, wherein the plurality of magnets are provided in such a manner that adjacent magnets of the plurality of magnets have poles different from each other.

2. The inductively coupled plasma processing apparatus as claimed in claim 1, wherein second ends of the first and second linear antennas, which are opposite to the first ends of the first and second linear antennas, are grounded.

3. The inductively coupled plasma processing apparatus as claimed in claim 1, wherein the linear antennas are surrounded by antenna protecting tubes made of quartz.

4. The inductively coupled plasma processing apparatus as claimed in claim 1, wherein the linear antennas are fabricated by using any one selected from the group consisting of copper, stainless steel and aluminum.

5. An inductively coupled plasma processing apparatus for a large area processing, the inductively coupled plasma processing apparatus comprising:

a reaction chamber;

a double comb-type antenna structure comprising a plurality of linear antennas horizontally and linearly arranged at an inner upper portion of the reaction chamber while being spaced from each other by a predetermined distance for receiving induced RF power, the linear antennas including a plurality of first linear antennas and second linear antennas arranged between the first linear antennas, first ends of the first linear antennas being protruded out of the reaction chamber and coupled to each other so as to be connected to a first induced RF power section, first ends of the second linear antennas being protruded out of the reaction chamber in opposition to the first ends of the first linear antennas and coupled to each other so as to be connected to a second induced RF power section, the first linear antennas being different from and electrically separated from the second linear antennas; and a plurality of magnets positioned relative to the linear antennas for creating a magnetic field perpendicularly crossing an electric field created by the linear antennas in such a manner that electrons perform a spiral movement;

wherein the plurality of magnets are positioned below the linear antennas and arranged between one of the first linear antennas and one of the second linear antennas adjacent to each other and parallel to each other, wherein the plurality of magnets are provided in such a manner that adjacent magnets of the plurality of magnets have poles different from each other, wherein the plurality of magnets are horizontally positioned between adjacent linear antennas while being spaced from each other.

6. An inductively coupled plasma processing apparatus for a large area processing, the inductively coupled plasma processing apparatus comprising:

a reaction chamber;

a double comb-type antenna structure comprising a plurality of linear antennas horizontally and linearly arranged at an inner upper portion of the reaction chamber while being spaced from each other by a predetermined distance for receiving induced RF power, the linear antennas including a plurality of first linear antennas and second linear antennas arranged between the first linear antennas, first ends of the first linear antennas being protruded out of the reaction chamber and coupled to each other so as to be connected to a first induced RF power section, first ends of the second linear antennas being protruded out of the reaction chamber in opposition to the first ends of the first linear antennas and coupled to each other so as to be connected to a second induced RF power section, the first linear antennas being different from and electrically separated from the second linear antennas; and a plurality of magnets positioned relative to the linear antennas for creating a magnetic field perpendicularly crossing an electric field created by the linear antennas in such a manner that electrons perform a spiral movement;

wherein the plurality of magnets are positioned below the linear antennas and arranged between one of the first linear antennas and one of the second linear antennas adjacent to each other and parallel to each other, wherein the plurality of magnets are provided in such a manner that adjacent magnets of the plurality of magnets have poles different from each other, wherein each of the plurality of magnets has a linear shape corresponding to a shape of the linear antennas.

7. An inductively coupled plasma processing apparatus for a large area processing, the inductively coupled plasma processing apparatus comprising:

a reaction chamber;

a double comb-type antenna structure comprising a plurality of linear antennas horizontally and linearly arranged at an inner upper portion of the reaction chamber while being spaced from each other by a predetermined distance for receiving induced RF power, the linear antennas including a plurality of first linear antennas and second linear antennas arranged between the first linear antennas, first ends of the first linear antennas being protruded out of the reaction chamber and coupled to each other so as to be connected to a first induced RF power section, first ends of the second linear antennas being protruded out of the reaction chamber in opposition to the first ends of the first linear antennas and coupled to each other so as to be connected to a second induced RF power section, the first linear antennas being different from and electrically separated from the second linear antennas; and a plurality of magnets positioned relative to the linear antennas for creating a magnetic field perpendicularly crossing an electric field created by the linear antennas in such a manner that electrons perform a spiral movement;

wherein the plurality of magnets are positioned below the linear antennas and arranged between one of the first linear antennas and one of the second linear antennas adjacent to each other and parallel to each other, wherein the plurality of magnets are provided in such a manner that adjacent magnets of the plurality of magnets have poles different from each other, wherein each of the plurality of magnets is surrounded by a magnet protecting tube made of quartz.

* * * * *